United States Patent
Darr et al.

(10) Patent No.: US 8,207,454 B2
(45) Date of Patent: Jun. 26, 2012

(54) ELECTRICAL JUNCTION BOX

(75) Inventors: Christopher J. Darr, Livonia, MI (US); John N. Topolewski, Westland, MI (US); Enric Aparicio Rollan, Valls (ES); Jordi Bigorra Vives, Valls (ES)

(73) Assignee: Lear Corporation, Southfield, MI (US)

( * ) Notice: Subject to any disclaimer, the term of this patent is extended or adjusted under 35 U.S.C. 154(b) by 340 days.

(21) Appl. No.: 12/469,958

(22) Filed: May 21, 2009

(65) Prior Publication Data

US 2009/0321129 A1    Dec. 31, 2009

Related U.S. Application Data

(60) Provisional application No. 61/076,200, filed on Jun. 27, 2008.

(51) Int. Cl.
*H02G 3/08* (2006.01)

(52) U.S. Cl. ........................................................ 174/520

(58) Field of Classification Search .................... 174/520
See application file for complete search history.

(56) References Cited

U.S. PATENT DOCUMENTS

| | | | |
|---|---|---|---|
| 4,135,226 A | 1/1979 | Kourimsky | |
| 4,689,718 A | 8/1987 | Maue et al. | |
| 5,478,244 A | 12/1995 | Maue et al. | |
| 5,655,927 A | 8/1997 | Maue et al. | |
| 5,995,380 A | 11/1999 | Maue et al. | |
| 6,116,916 A * | 9/2000 | Kasai | 439/76.2 |
| 6,203,358 B1 * | 3/2001 | Kasai | 439/404 |
| 6,494,723 B2 | 12/2002 | Yamane et al. | |
| 6,712,623 B2 | 3/2004 | Sumida | |
| 6,894,891 B2 | 5/2005 | Darr et al. | |
| 7,175,488 B2 | 2/2007 | Pavlovic et al. | |
| 2008/0108230 A1 | 5/2008 | Kasai | |
| 2008/0310121 A1 * | 12/2008 | Yamashita et al. | 361/720 |

FOREIGN PATENT DOCUMENTS

EP    0903766 A3    3/1999

* cited by examiner

*Primary Examiner* — Timothy Thompson
*Assistant Examiner* — Hiram E Gonzalez
(74) *Attorney, Agent, or Firm* — Brooks Kushman P.C.

(57) ABSTRACT

An electrical junction box for an automotive vehicle. The junction box includes an upper cover and a lower cover. The lower cover may be constructed as a unitary one-piece molded body that defines a plurality of separate terminal cavities. Each of the separate terminal cavities is adapted to receive a single wire terminal without a housing connector that has multiple wire-terminal receptacles. In addition, the junction box may include an electrical circuit board and a busbar between the upper cover and the lower cover.

20 Claims, 3 Drawing Sheets

ELECTRICAL JUNCTION BOX

CROSS-REFERENCE TO RELATED APPLICATION

This application claims the benefit of the U.S. Provisional Application filed Jun. 27, 2008, and having Application No. 61/076,200, the entire disclosure of which is incorporated by reference herein.

BACKGROUND

1. Field of the Invention

The present invention relates to an electrical junction box, such as may be used in an automotive vehicle.

2. Background Art

Automotive vehicles include many electrical systems, such as lighting, signaling, instrumentation, and engine control. Networks of wires and cables, which run throughout the vehicle, generally interconnect these electrical systems. Each of these electrical subsystems includes numerous electrical components, such as fuses, relays and connectors. In some vehicles, the fuses and relays are distributed throughout the vehicle. Other vehicles have many of the wires and cables routed through an electrical junction box, which houses most or all of the fuses and relays in the vehicle. In this manner, the electrical junction box can be considered as a container for electrical junctions.

Automotive vehicles have used junction boxes similar to junction box 1 illustrated in FIG. 1 to distribute electrical power among a variety of electrical systems in the vehicle. The junction box 1 of FIG. 1 receives a number of housing connectors 2. Each housing connector 2 has multiple wire-terminal receptacles 3 to receive a number of wired terminals 4. Once the housing connector 2 receives the wired terminals 4, the housing connector 2 can inserted as a unit in the junction box 1. The combination of the housing connector 2 and the wired terminals 4 may be referred to as a wire harness that carries the electrical power from the junction box 1 to electrical systems in the automotive vehicle. Thus, the wire harness includes multiple wires arranged and bundled together so that the wires can be connected as a unit to the junction box 1.

FIG. 2 shows the junction box of FIG. 1 assembled with the housing connector 2. The housing connector 2 is separate from top and bottom covers 5, 6 of the junction box 1. In addition, FIG. 2 illustrates a fuse 7, the housing connector 2, and one of the wired terminals 4 inserted into the junction box 1.

SUMMARY OF THE INVENTION

An electrical junction box for use in an automotive vehicle is provided. The junction box includes an upper cover and a lower cover. The lower cover may be constructed as a unitary one-piece molded body that defines a plurality of separate terminal cavities. Each of the separate terminal cavities may be adapted to receive a single wire terminal without a housing connector that has multiple wire-terminal receptacles. In addition, the junction box may include an electrical circuit board and a busbar between the upper cover and the lower cover. Furthermore, the junction box may receive a plurality of electrical components that are configured to control current flow between a first and second conducting tab. The terminal cavities may be positioned relative to the second conducting tabs such that each of the terminal cavities acts as a guide that facilitates positioning the wire terminals to be retained relative to the second conducting tabs. The upper cover may have component cavities that guide each of the first conducting tabs of the electrical components through the upper cover. Each of the wire terminals may be physically retained relative to one of the second conducting tabs to establish electrical connections between the second conducting tabs and the wire terminals.

DETAILED DESCRIPTION

Embodiments of the present invention generally provide an electrical junction box 10 for an automotive vehicle. In general, the junction box 10 can distribute electric power to and from electrical wires as well as various electric components electrically mounted within the junction box 10. In addition, the junction box 10 may operate as a fuse box that can enclose one or more fuses or fuse blocks. The junction box 10 may be used in number of locations in the vehicle, such as a passenger compartment, an engine compartment, and a boot area of the vehicle. For example, the junction box 10 may hold one or more electronic or electrical components for various electric devices in the engine compartment, such as a cooling fan, an anti-lock brake pump, and an engine control unit.

Figure 4:
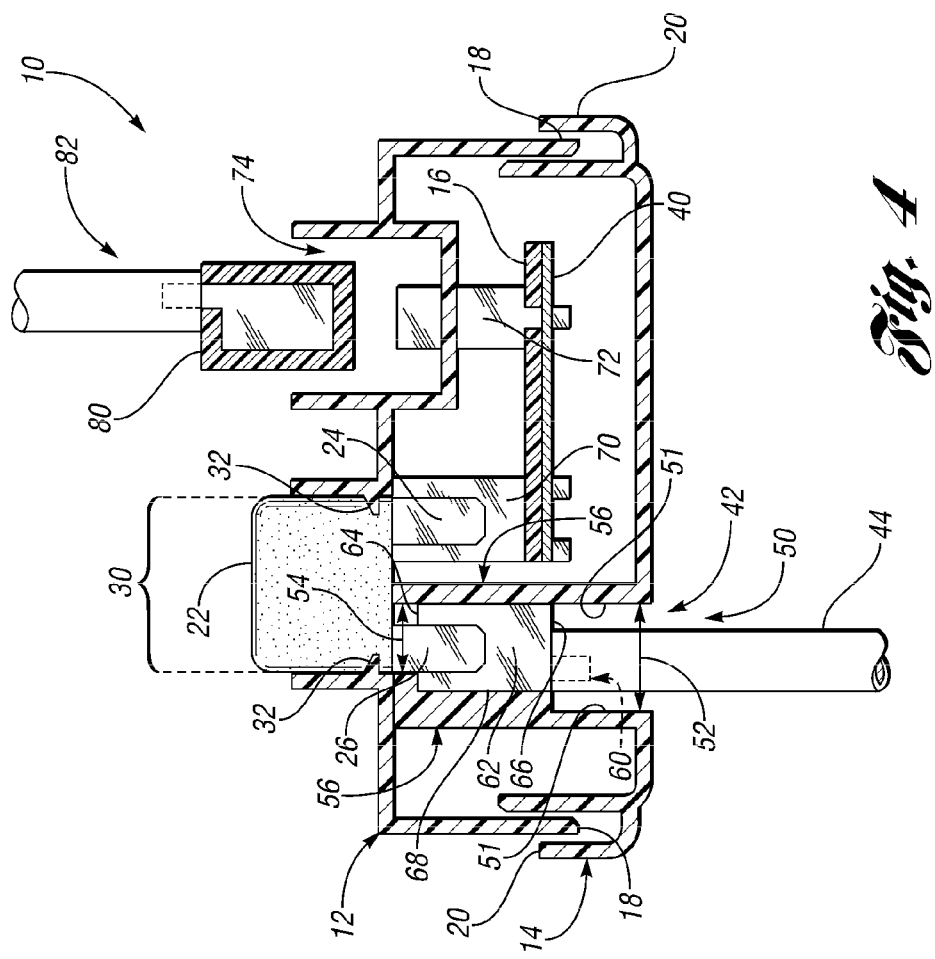
FIG. 4 is a diagrammatical sectional view illustrating the junction box of FIG. 3 with one of the separate terminal cavities in the lower cover receiving one of the wire terminals.
Figure 3:
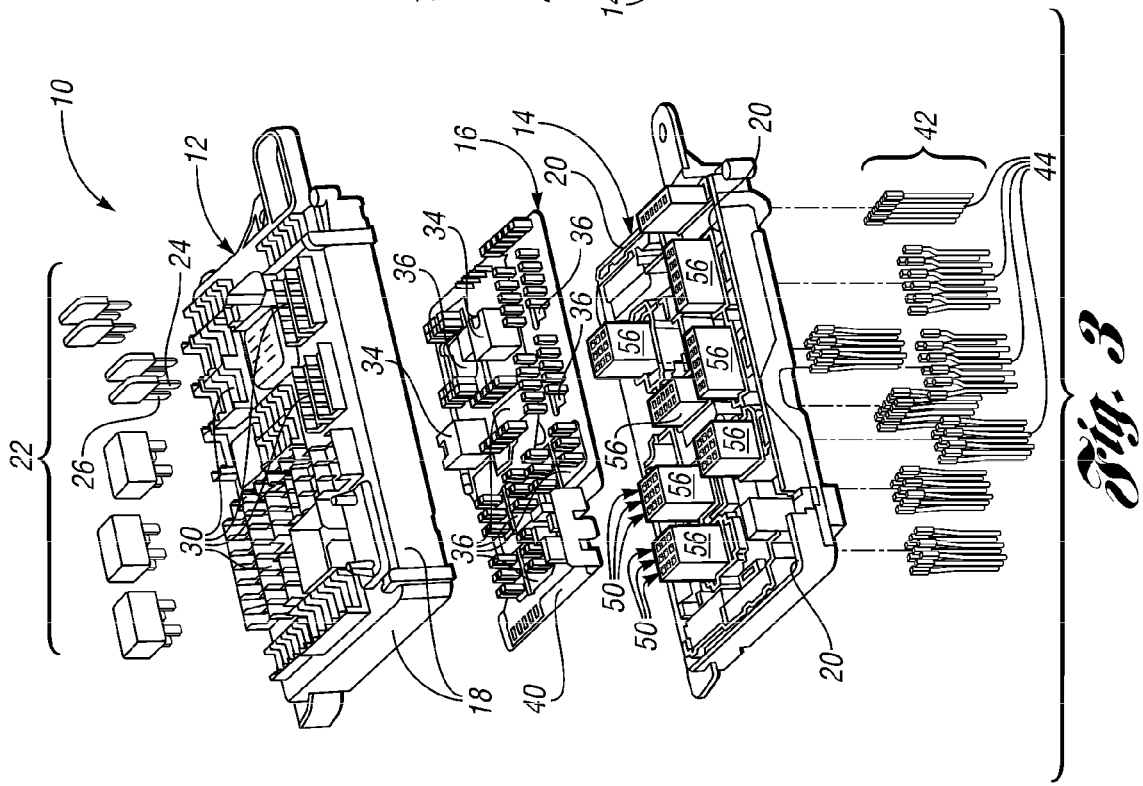
FIG. 3 is a perspective view illustrating an electrical junction box having a upper cover, an electrical circuit board, and a lower cover defining a plurality of separate terminal cavities for receiving wire terminals without the housing connector shown in FIGS. 1 and 2.

With reference to FIGS. 3-4, the junction box 10 includes an upper cover 12, a lower cover 14, and an electrical circuit board 16. The upper cover 12 and the lower cover 14 fit together (shown in FIG. 4) to hold or support one or more electronic or electrical components, such as the circuit board 16, in the junction box 10. Furthermore, the upper cover 12 may include an outer perimeter 18 and the lower cover 14 may include side walls 20. The side walls 20 mate with the outer perimeter 18 to enclose the electronic or electrical components within the junction box 10. In addition, different runs of raceway or cable may be joined, connected, and/or branched to electrical conductors in the junction box 10.

As illustrated in FIGS. 3-4, the upper cover 12 is adapted to receive a plurality of electrical components 22, such as fuses, switches, relays, or other plug-in devices. Each electrical component 22 may have a first conducting tab 24 and a second conducting tab 26. For example, the first and second conducting tabs 24, 26 may be metal tabs. As shown, the upper cover 12 defines a plurality of component cavities or receptacles 30 for receiving the electrical components 22. Each of the receptacles 30 is adapted to receive at least a portion of the electrical component 22, such as the first and second conducting tabs 24, 26. In addition, the receptacles 30 can guide first and second conducting tabs 24, 26 through the upper cover 12 to ensure a proper electrical connection between the electrical component 22 and the junction box 10.

FIG. 4 shows one of the electrical components 22 as a fuse having the first and second conducting tabs 24, 26 inserted in the upper cover 12 of the junction box 10. However, the electrical component 22 may be a different type of plug-in electrical component, such as a switch or relay. When the upper cover 12 receives one of the electrical components 22, the electrical component 22 may electrically connect to the circuit board 16. In operation, the electrical component 22 can control or regulate current flow between the first and second conducting tabs 24, 26 to control various components in the vehicle. For example, the electrical component 22 may control power door locks, power seats, turn signals, or windshield wipers in the automotive vehicle. The electrical component 22 can be readily inserted and removed from the upper cover 12 and therefore may be referred to as a serviceable or plug-in component.

The upper cover 12 may have at least one latching element 32 within each of the component cavities 30. FIG. 4 shows two latching elements 32 as barbs or detents. However, the latching element 32 may be any suitable latching mechanism. The latching element 32 can physically secure the electrical components 22 within the component cavity 30. The latching element 32 may allow the electrical component 22 to be removed from the component cavities 30 in the event that the electrical component 22 requires maintenance or replacement. Alternatively, the electrical components 22 may be retained in the upper cover 12 without the latching elements 32. For example, circuit board terminals or contact elements, such as contact element 70, may secure or retain the electrical components 22 in the upper cover 12. In another example, both the latching elements 32 and circuit board terminals may secure the electrical components 22 in the upper cover 12 to create a more robust and sturdy mechanical connection between electrical components 22 and the upper cover 12.

Referring again to FIGS. 3-4, the circuit board 16 is adapted to be positioned and assembled between the upper cover 12 and the lower cover 14. The circuit board 16 may be a printed circuit board (PCB) having one or more electrical elements. In addition, the circuit board 16 may include a number of voltage regulators 34, relays, circuits, and/or contact elements for distributing or controlling power to various components in the automotive vehicle. Furthermore, the circuit board 16 may include a plurality of circuit board openings 36 (shown in FIG. 3). The circuit board openings 36 allow the circuit board 16 to insert or pass through the lower cover 14 to a position as shown in FIG. 4.

The junction box 10 may include an electrically conductive track or busbar 40. The busbar 40 electrically connects to the electrical components 22 as well as the multiple electrical elements in the circuit board 16. As shown in FIG. 4, the busbar 40 electrically connects the circuit board 16 to a fuse. However, the busbar 40 can electrically connect the circuit board 16 to other electrical components, such as relays and switches. Like the circuit board 16, the busbar 40 is adapted to be positioned and assembled between the upper cover 12 and the lower cover 14. The busbar 40 in FIG. 4 is shown below the circuit board 16. However, the busbar 40 may be positioned above the circuit board 16, depending on the configuration of the junction box 10. In operation, the busbar 40 distributes current from an input, such as a power source external to the junction box 10, to a plurality of loads. The busbar 40 may be made of any type of electrically conductive material or combination of materials, such as copper or a copper alloy.

The lower cover 14 is constructed or formed as a single part and is positioned predominantly below the circuit board 16 as well as the busbar 40. As a single part, the lower cover 14 may be a single-shot injection molded part molded from a polymer, injection-moldable plastic, or other suitable material. In addition, the lower cover 14 may be constructed as a unitary one-piece molded body that is materially uniform and continuous throughout. Thus, the lower cover 14 may be formed from a single type of material that has substantially the same material properties in all portions of the lower cover 14. For example, the lower cover 14 may be a unitary molded body characterized as having a single material composition. Furthermore, the lower cover 14 may be materially continuous or materially uninterrupted within the molded body of the lower cover 14. Thus, the lower cover 14 may be free from secondary parts that would create internal boundaries or fault lines when assembled to the molded body. Similarly, the upper cover 12 may be a single-shot injection molded part molded from a polymer, plastic, or other suitable material.

Figure 5:
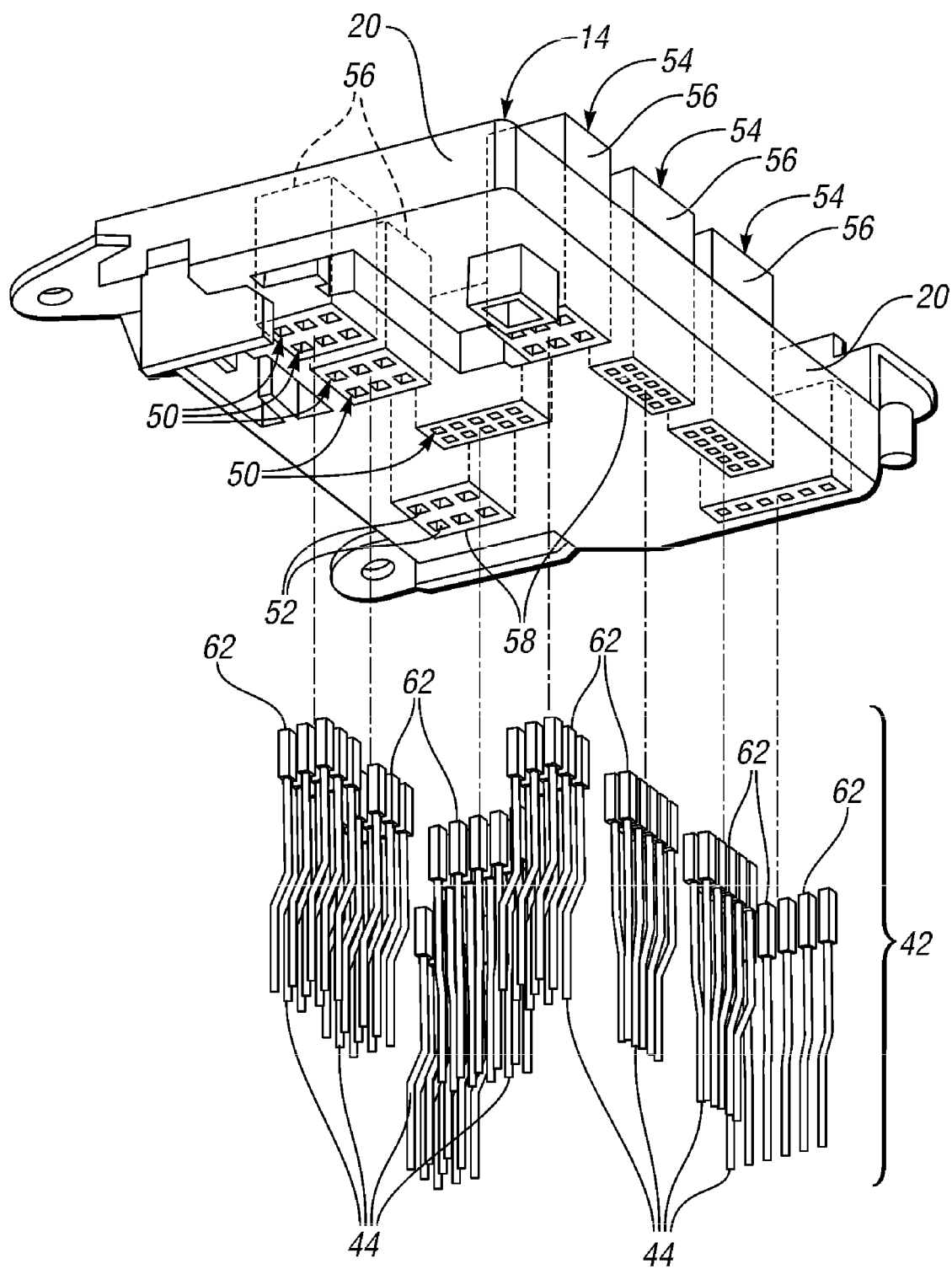
FIG. 5 is a perspective view similar to FIG. 3, but illustrating the separate terminal cavities in the lower cover having insertion end opening for receiving each of the wire terminals.

With reference to FIGS. 3-5, the junction box 10 is adapted to receive a plurality of wire terminals 42. Each of the wire terminals 42 has a single electrical wire 44 and no more than one electrical wire 44. For example, each electrical wire 44 and corresponding wire terminal 42 may be crimped together to establish a mechanical and electrical connection between the electrical wires 44 and the wire terminals 42. The wire terminals 42 carry current from the junction box 10 to one or more loads in the automotive vehicle. Each of the wire terminals 42 may be referred to as a single wire terminal 42 since each of the wire terminals 42 can individually insert into lower cover 14 of the junction box 10. The wire terminals 42 are shown as female wire terminals in FIGS. 3-5. However, the wire terminals 42 may be male wire terminals, or a combination of both male and female wire terminals depending on the particular application of the junction box 10 in the vehicle.

The lower cover 14 of the junction box 10 defines a plurality of separate terminal cavities 50. Furthermore, the lower cover 14 includes a plurality of inner cavity surfaces 51 (shown in FIG. 4) each of which defines the separate terminal cavity 50 in the lower cover 14. In such an example, the lower cover 14 is materially continuous and uninterrupted between the inner cavity surfaces 51 and the side walls 20 of the lower cover 14. Since the lower cover 14 is a single part, the terminal cavities 50 are integrally molded within the lower cover 14. In addition, each of the terminal cavities 50 is adapted to receive one of the wire terminals 42. In other words, each terminal cavity 50 can receive only one of the wire terminals 42 and no more than one of the wire terminals 42. Furthermore, each of the separate terminal cavities 50 may be adapted to receive any one of the wire terminals 42. In addition, the number of terminal cavities 50 may equal the number of wire terminals 42.

Referring to FIGS. 4-5, each terminal cavity 50 in the lower cover 14 has an insertion end opening 52 and a connection end opening 54. As shown, the insertion end opening 52 is at one end of the terminal cavity 50, or insertion end, while the connection end opening 54 at an opposite end of the terminal cavity 50, or interface end. The insertion end opening 52 is adapted to receive the wired terminal 42 that is inserted into the terminal cavity 50. Thus, each terminal cavity 50 may receive each wire terminal 42 through the insertion end opening 52. Furthermore, the insertion end opening 52 may be at least twice as large as the connection end opening 54 to facilitate insertion of the wired terminal 42 to be received in respective terminal cavity 50. For example, the surface area defining the insertion end opening 52 may be at least twice as large as the surface area defining the connection end opening 54.

Figure 1:
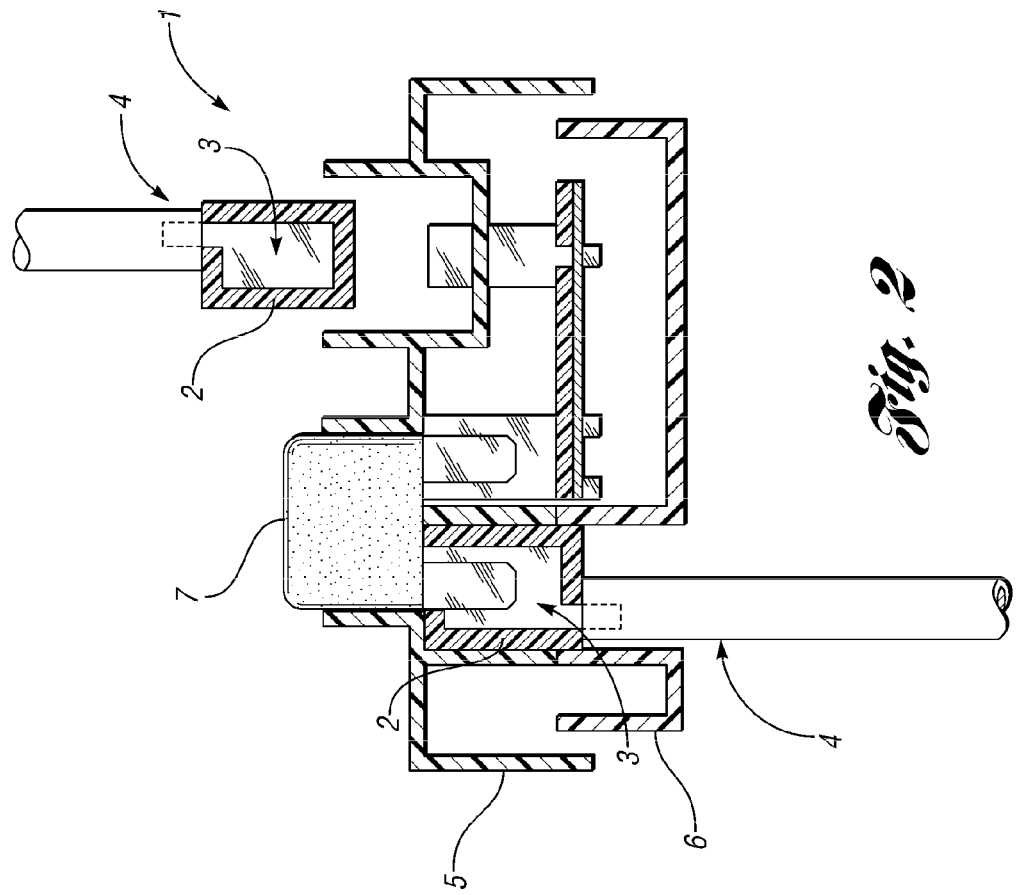
FIG. 1 is an exploded perspective view illustrating a junction box having a top cover, a circuit board, and a bottom cover for receiving a housing connector with wire-terminal receptacles.
Figure 2:
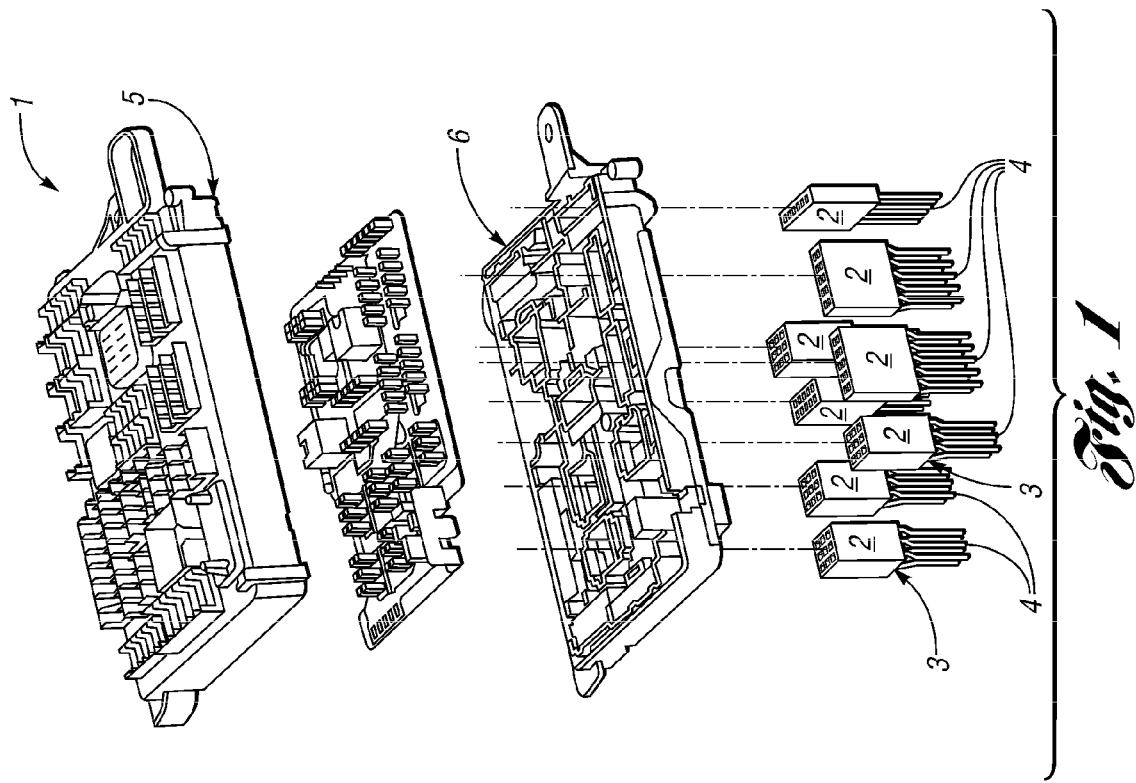
FIG. 2 is a diagrammatical sectional view illustrating the junction box of FIG. 1 assembled and inserted with a fuse, the housing connector, and one of the wired terminals in the housing connector.

As depicted in FIGS. 3-5, each of the wire terminals 42 can be individually secured in one of the separate terminal cavities 50 without a separate housing connector that has multiple wire-terminal receptacles. Such a separate housing connector includes the type of housing connectors as illustrated in FIGS. 1-2. Eliminating the separate housing connectors can provide a number of benefits for the junction box 10.

When the wire terminal 42, which can be any one of the wire terminals 42, is inserted in the terminal cavity 50, the single wire terminal 42 forms a single electrical connection to the one of the electrical components 22. For example, when the single wire terminal 42 is inserted in the lower cover 14 of FIG. 4, the single electrical connection is formed between the single wire terminal 42 and the second conducting tab 26 of electrical component 22. In such an example, the electrical connection allows current to flow from the busbar 40, through the electrical component 22, through the single wire terminal 42, and to one of the loads in the vehicle, such as the engine control unit (not shown).

As illustrated in FIG. 4, terminal cavity 50 may be positioned relative to the part of the receptacle 30 that receives the second conducting tab 26 of the electrical component 22. Such relative positioning of the terminal cavities 50 relative to the second conducting tabs 26 allows each the terminal cavities 50 to act as a guide that facilitates positioning the wire terminals 42, to be retained, relative to the second conducting tabs 26. In addition, the terminal cavities 50 position or guide the wire terminals 42 without the wire terminals 42 being directly latched to the lower cover 14. In other words, the terminal cavities 50 may not required to secure the wire terminals 42 relative to the second conducting tabs 26.

As shown in FIG. 4, the single wire terminal 42 is secured to the second conducting tab 26 of the electrical component 22 (e.g., fuse). However, the wired terminal 42 may be secured within the terminal cavity 50 by friction and/or a retention system having suitable securing means. Securing means may include a latch, clasp, detent, retaining tab or other suitable mechanism.

Referring again to FIGS. 3-5, at least one of the terminal cavities 50 may extend above the side walls 20 of the lower cover 14. For example, the terminal cavity 50 in FIG. 4 is shown extending to the upper cover 12. In such an example, the terminal cavity 50 extends up to the upper cover 12 to facilitate the single electrical connection between the single wire terminal 42 and the electrical component 22. Similarly, the terminal cavities 50 may extend near the receptacles 30 in the upper cover 12 to receive at least a portion of the electrical components 22, such as the second conducting tabs 26 of electrical components 22. Unlike the junction box 1 of FIGS. 1-2 where the lower cover 6 does not extend about its side walls, the junction box 10 of FIGS. 3-5 has at least a portion of the lower cover 14 extending about the side walls 20.

With continuing reference to FIGS. 3-5, the lower cover 14 may define a plurality of housing projection portions 56 such that the lower cover 14 is a single part. The projection portions 56 are shown extending above the busbar 40 in FIG. 4. However, the projection portions 56 may extend to any position above the side walls 20 of the lower cover 14. For example, each of the projection portions 56 may extend to a position between the upper cover 12 and the circuit board 16. In addition, the projection portions 56 may insert completely through the circuit board openings 36 (shown in FIG. 3) to facilitate positioning of the circuit board 16 with respect to the lower cover 14.

As shown in FIGS. 3-5, the projection portions 56 of the lower cover 14 include the terminal cavities 50. Thus, at least one of the terminal cavities 50 may extend completely through one of the circuit board openings 36 to a predetermined position between the upper cover 12 and the circuit board 16. Furthermore, the projection portions 56 of the lower cover 14 may define the insertion and connection end openings 52, 54 of the separate terminal cavities 50. In addition, each of the projection portions 56 may define at least one grouping 58 (referenced in FIG. 5) of the terminal cavities 50 where the terminal cavities 50 are spaced apart from each other in a predetermined pattern. For example, the grouping 58 may be a three-by-three (3×3) matrix pattern of the terminal cavities 50. In another example, the grouping 58 may be a two-by-five (2×5) matrix pattern of the terminal cavities 50.

As illustrated in FIG. 4, a connector 60 may be provided as part of the single wire terminal 42 or as a separate component between the lower cover 14 and the receptacles 30 in the upper cover 12. For example, the connector 60 may indicate the part of the single wire terminal 42 where the electrical wire 44 and the wire terminal 42 may be crimped together to establish a mechanical and electrical connection between the electrical wire 44 and the wire terminal 42. The connector 60 is made of an electrically conductive material, such as metal. The connector 60 of FIG. 4 is configured to be physically retained relative to one of the second conducting tabs 26. In addition, the connector 60 facilitates or establishes the electrical connection between one of the electrical components 22 and the electrical wire 44 that carries current to one of the loads in the vehicle.

Referring to FIGS. 4-5, tabs 62 may be provided between the receptacles 30 and the terminal cavities 50 in the lower cover 14. For example, the tab 62 shown in FIG. 4 is shown as a wired female terminal positioned between the component cavity 30 and the terminal cavity 50 to electrically interconnect the electrical wire 44 to one of the second conducting tabs 26. However, the tabs 62 may be any suitable electrical conductors to facilitate the electrical connection between the electrical wire 44 and the second conducting tab 26. Thus, the tabs 62 may be referred to as conductive interconnections that facilitate the single electrical connection between the single wire terminal 42 and one of the electrical components 22.

With continuing reference to FIGS. 4-5, each of the tabs 62 has two electrical contacts 64, 66 and an intermediate portion 68. The intermediate portion 68 is the portion of the tab 62 between the two electrical contacts 64, 66. As shown, the two electrical contacts 64, 66 are on opposing sides of the intermediate portion 68, but are electrically connected through the intermediate portion 68. The tabs 62 may be part of the single wire terminal 42. Alternatively, the tabs 62 may be a separate component that the electrical wire 44 connects to. In the event that the tabs 62 are separate components, the lower cover 14 may be molded around the intermediate portion 68 while leaving the two electrical contacts 64, 66 exposed in the junction box 10. Molding the intermediate portion 68 of the tab 62 in the lower cover 14 secures the tab 62 in the lower cover 14.

As illustrated in FIG. 4, the junction box 10 may include at least one a circuit board terminal or contact element 70. The contact element 70 interconnects the busbar 40 and/or circuit board 16 to one or more of the electrical components 22. As shown in FIG. 4, the contact element 70 receives the first conducting tab 24 of a fuse to connect to the fuse to the busbar 40. The contact element 70 is shown as a PCB female terminal. However, the contact element 70 may be any type of electrical contact element for interconnecting the electrical components 22 to the busbar 40 or the circuit board 16. For example, the contact element 70 may be a PCB male terminal.

Referring again to FIG. 4, the junction box 10 may include a circuit board connector or tab 72. Tab 72 is shown connected to the busbar 40 in FIG. 4. However, tab 72 may connect to the circuit board 16. As shown, tab 72 extends from the busbar 40 and into a connector cavity 74 in the upper cover 12. The connector cavity 74 of FIG. 4 is adapted to receive a housing connector 80. The housing connector 80 houses a second wire terminal 82 that can be inserted into the connector cavity 74 of the upper cover 12. When the housing connector 80 is sufficiently inserted into the connector cavity 74, the wire terminal 82 electrically connects to tab 72 to provide an electrical connection between the wire terminal 82 and the busbar 40. With the electrical connection between the wire terminal 82 and the busbar 40, the second wire terminal 82 can carry electric power to the junction box 10 from the power source located outside the junction box 10.

The present invention may provide a number of advantages. One advantage may include the lower cover 14 being a single injection molded part to reduce the cost of materials and/or manufacturing. In addition, the single injection molded part may allow connection of one or more electrical wires 44 to the lower cover 14 without the need for a conventional housing connector. This may reduce the cost of materials and/or manufacturing of the junction box 10. Another advantage may include simplifying the manufacturing process of the junction box 10. For example, connecting the wire terminals 42 to the junction box 10 without a conventional housing connector or the separate housing connectors of FIGS. 1-2 reduces the number of parts required to fabricate the junction box 10. Another advantage may include reducing the size and weight of the junction box since conventional housing connector are not required.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An electrical junction box to receive a plurality of wire terminals a plurality of electrical components, the junction box comprising:
    an upper cover defining a plurality of receptacles to receive the electrical components;
    a lower cover defining a plurality of separate terminal cavities to receive a single wire terminal; and
    an electrical circuit board positioned between the upper cover and the lower cover, the electrical circuit board electrically connecting to one of the electrical components when the upper cover receives the one electrical component, and the single wire terminal forming an electrical connection to the one electrical component when the single wire terminal is inserted in one of the separate terminal cavities;
    wherein the circuit board includes a plurality of circuit board openings, at least one of the terminal cavities extending completely through one of the circuit board openings.

2. The junction box of claim 1 wherein each of the wire terminals is secured in one of the separate terminal cavities without a housing connector that has multiple wire-terminal receptacles.

3. The junction box of claim 1 wherein the number of terminal cavities equals the number of wire terminals.

4. The junction box of claim 1 wherein the lower cover is single-shot injection molded from an injection-moldable plastic.

5. The junction box of claim 1 wherein each terminal cavity has an insertion end opening at one end of the terminal cavity and a connection end opening at an opposite end of the terminal cavity, and wherein the insertion end opening is at least twice as large as the connection end opening.

6. The junction box of claim 1 further including a plurality of conductive interconnections between the receptacles in the upper cover and the terminal cavities in the lower cover to facilitate the electrical connection.

7. The junction box of claim 6 wherein each of the conductive interconnections has two opposing contact portions and an intermediate portion between the contact portions, the unitary one-piece molded body of the lower cover being around the intermediate portion of the conductive interconnections to secure the conductive interconnections in the lower cover.

8. The junction box of claim 1 wherein the lower cover includes a plurality of projection portions that include the separate terminal cavities, each of the projection portions inserting completely through respective circuit board openings.

9. The junction box of claim 1 wherein the lower cover includes a plurality of projection portions that include the separate terminal cavities, each of the projection portions extending to a position between the upper cover and the electrical circuit board.

10. The junction box of claim 1 wherein the upper cover has an outer perimeter and the lower cover has side walls that mate with the outer perimeter of the upper cover, at least one of the terminal cavities extending above the side walls to a predetermined position between the upper cover and the electrical circuit board.

11. An electrical junction box to receive a plurality of wire terminals and a plurality of electrical components, the junction box comprising:
    an upper cover defining a plurality of receptacles to receive the electrical components;
    a lower cover defining a plurality of separate terminal cavities to receive a single wire terminal;
    a plurality of conductive interconnections within the lower cover and positioned between the receptacles in the upper cover and the separate terminal cavities in the lower cover; and
    an electrical circuit board positioned between the upper and lower covers, the electrical circuit board electrically connecting to one of the electrical components when the upper cover receives the one electrical component, and each of the conductive interconnections forming an electrical connection between the single wire terminal and the one electrical component when the single wire terminal is inserted in one of the separate terminal cavities;
    wherein the lower cover includes a plurality of projection portions that include the separate terminal cavities, each of the projection portions extending to a position between the upper cover and the electrical circuit board.

12. The junction box of claim 11 wherein the lower cover is constructed as a unitary one-piece single-shot injection molded body that is materially uniform and continuous throughout, each of the separate terminal cavities being adapted to receive each of the wire terminals such that each of the separate terminal cavities receives no more than one of the wire terminals.

13. The junction box of claim 11 wherein the circuit board includes a plurality of circuit board openings, at least one of the terminal cavities extending completely through one of the circuit board openings.

14. The junction box of claim 13 wherein the projection portions insert through respective circuit board openings.

15. The junction box of claim 1 wherein the lower cover is constructed as a unitary one-piece single-shot injection molded body that is materially uniform and continuous throughout, each of the separate terminal cavities being adapted to receive each of the wire terminals such that each of the separate terminal cavities receives no more than one of the wire terminals.

16. An electrical junction box to receive a plurality of wire terminals and a plurality of electrical components, the junction box comprising:
- an upper cover defining a plurality of receptacles adapted to receive the electrical components;
- a lower cover defining a plurality of separate terminal cavities to receive a single wire terminal; and
- an electrical circuit board positioned between the upper cover and the lower cover, the electrical circuit board electrically connecting to one of the electrical components when the upper cover receives the one electrical component, and the single wire terminal forming an electrical connection to the one electrical component when the wire terminal is inserted in one of the separate terminal cavities;
- wherein the lower cover includes a plurality of projection portions that include the separate terminal cavities, each of the projection portions extending to a position between the upper cover and the electrical circuit board.

17. The junction box of claim 16 wherein the circuit board includes a plurality of circuit board openings, at least one of the terminal cavities extending completely through one of the circuit board openings.

18. The junction box of claim 17 wherein the projection portions insert through respective circuit board openings.

19. The junction box of claim 16 wherein the lower cover is a unitary one-piece single-shot injection molded body that is materially uniform and continuous throughout.

20. The junction box of claim 16 wherein each of the separate terminal cavities is adapted to receive each of the wire terminals such that each of the separate terminal cavities receives no more than one of the wire terminals.

* * * * *

UNITED STATES PATENT AND TRADEMARK OFFICE
CERTIFICATE OF CORRECTION

| | | |
|---|---|---|
| PATENT NO. | : 8,207,454 B2 | |
| APPLICATION NO. | : 12/469958 | |
| DATED | : June 26, 2012 | |
| INVENTOR(S) | : Christopher J. Darr et al. | |

It is certified that error appears in the above-identified patent and that said Letters Patent is hereby corrected as shown below:

Column 7, Line 45-46, Claim 4:

After "plurality of wire terminals" insert -- and --

Signed and Sealed this
Twenty-fifth Day of September, 2012

David J. Kappos
*Director of the United States Patent and Trademark Office*

UNITED STATES PATENT AND TRADEMARK OFFICE
CERTIFICATE OF CORRECTION

Page 1 of 1

| | |
|---|---|
| PATENT NO. | : 8,207,454 B2 |
| APPLICATION NO. | : 12/469958 |
| DATED | : June 26, 2012 |
| INVENTOR(S) | : Christopher J. Darr et al. |

It is certified that error appears in the above-identified patent and that said Letters Patent is hereby corrected as shown below:

Column 7, Line 45-46, Claim 1:

After "plurality of wire terminals" insert -- and --

This certificate supersedes the Certificate of Correction issued September 25, 2012.

Signed and Sealed this
First Day of January, 2013

David J. Kappos
*Director of the United States Patent and Trademark Office*